United States Patent [19]

Weiner

[11] Patent Number: 5,114,876

[45] Date of Patent: May 19, 1992

[54] SELECTIVE EPITAXY USING THE GILD PROCESS

[75] Inventor: Kurt H. Weiner, Campbell, Calif.

[73] Assignee: The United States of America as represented by the United States Department of Energy, Washington, D.C.

[21] Appl. No.: 623,854

[22] Filed: Dec. 7, 1990

[51] Int. Cl.$^5$ .................. H01L 21/20; H01L 21/266; H01L 21/268

[52] U.S. Cl. ........................ 437/89; 437/90; 437/173; 437/174; 148/DIG. 105; 148/DIG. 106

[58] Field of Search .................. 437/173, 174, 89, 90; 148/DIG. 105, DIG. 106

[56] References Cited

U.S. PATENT DOCUMENTS

| 4,637,129 | 1/1987 | Derkits, Jr. et al. | 437/89 |
| 4,975,387 | 12/1990 | Prokes et al. | 148/DIG. 3 |
| 4,983,536 | 1/1991 | Bulat et al. | 437/131 |

OTHER PUBLICATIONS

J. R. Abelson, et al. "Epitaxial Ge$_x$Si$_{1-x}$/Si(100) structures produced by pulsed laser mixing of evaporated Ge on Si(100) substrates" Applied Physics Letters 52(3), Jan. 18, 1988 pp. 230-232.

Chang, et al "Formation of In$_x$Ga$_{1-x}$As/GaAs heteroepitaxial layers using a pulsed laser driven rapid melt-solidification process" Applied Physics Letters 56(19), May 7, 1990 pp. 1844-1846.

Primary Examiner—Brian E. Hearn
Assistant Examiner—Linda J. Fleck
Attorney, Agent, or Firm—Henry P. Sartorio; L. E. Carnahan; William R. Moser

[57] ABSTRACT

The present invention comprises a method of selective epitaxy on a semiconductor substrate. The present invention provides a method of selectively forming high quality, thin GeSi layers in a silicon circuit, and a method for fabricating smaller semiconductor chips with a greater yield (more error free chips) at a lower cost. The method comprises forming an upper layer over a substrate, and depositing a reflectivity mask which is then removed over selected sections. Using a laser to melt the unmasked sections of the upper layer, the semiconductor material in the upper layer is heated and diffused into the substrate semiconductor material. By varying the amount of laser radiation, the epitaxial layer is formed to a controlled depth which may be very thin. When cooled, a single crystal epitaxial layer is formed over the patterned substrate. The present invention provides the ability to selectively grow layers of mixed semiconductors over patterned substrates such as a layer of Ge$_x$Si$_{1-x}$ grown over silicon. Such a process may be used to manufacture small transistors that have a narrow base, heavy doping, and high gain. The narrowness allows a faster transistor, and the heavy doping reduces the resistance of the narrow layer. The process does not require high temperature annealing; therefore materials such as aluminum can be used. Furthermore, the process may be used to fabricate diodes that have a high reverse breakdown voltage and a low reverse leakage current.

20 Claims, 2 Drawing Sheets

SELECTIVE EPITAXY USING THE GILD PROCESS

The United States Government has rights in this invention pursuant to Contract No. W-7405-ENG-48 between the United States Dapartment of Energy and the University of California for the operation of Lawrence Livermore National Laboratory.

BACKGROUND OF THE INVENTION

1. Field of the Invention

The present invention relates to semiconductor fabrication processes. More particularly, the present invention comprises a method for selective epitaxy using laser annealing. The method has many applications, including production of thin film transistors. Such transistors may be formed over insulators used in Liquid Crystal Display (LCDs).

2. Decription of Related Art

Semiconductor fabrication is a multi-billion dollar industry that has emerged into international importance in the past 10-20 years. An important part of the business is intergrated circuits, including computer chips and many other electrical components which are made from semiconductor material. Integrated circuits are basic building blocks for computers and other electronic equipment.

As the semiconductor industry has grown, improved processing techniques have been sought continually. Improved processing techniques can increase efficiency of the manufacturing process or the improved technique may provide a better product. For competitive businesses, important considerations include the cost of the component, and the yield of the manufacturing processes. The components themselves have been continually refined for enhanced capabilities; today's components are faster and more reliable than the components of the past.

A number of methods have been developed for manufacturing integrated circuits. Generally, fabrication processes begin with a thin wafer of semiconductor crystal material, such as silicon, which is the substrate upon which the intergrated circuits will be manufactured. The actual integrated circuits are formed in a complicated series of steps, typically involving many different processes before the final product is obtained. In the process, many different layers may be built up, including layers of single crystal silicon, polycrystalline silicon, or metal. Masking techniques may be applied to remove selected portions using photoresist or to dope selected portions in order to achieve the desired electrical characteristics in those selected portions of the substrate or layers. Many manufacturing methods are known by those skilled in the art. The result of the manufacturing process is a structure on the micron-sized scale.

An important process is growth of an epitaxial layer, which is a layer of a material grown over a substrate layer. Epitaxial layers may be grown by a number of processes. In "liquid-phase epitaxy" (LPE), the epitaxial layer is grown from liquid that solidifies around the substate. In LPE, the substrate serves as the seed crystal onto which the new crystalline material grows, and also defines the shape of the growth. In "vapor-phase epitaxy" (VPE), a heated substrate is placed in an atmosphere having a vapor containing the constituents of the new epitaxial layer. The vapor crystallizes on a substrate, which acts as the seed crystal. An advantage of these processes is that the pure material can be grown at temperatures well below the melting point of the semiconductor.

In another versatile method for growing epitaxial layers, molecular beam epitaxy (MBE), a molecular beam is directed at the substrate in a vacuum. In MBE, a layer may be made that is a combination of various elements. For example, in the growth of AlGaAs on GaAs substrates, the Al, Ga, and As components, along with the dopants, are heated in separate cylindrical cells. Collimated beams of these constituents escape into the vacuum and are directed onto the surface of the substate. The rates at which these atomicc beams strike the surface can be closely controlled. If MBE is done at a high temperature (about 560° C. for GaAs), then growth of very high quality crystals results. However, if MBE is done at a lower temperature, then the layer is amporphous (non-crystalline) to some extent. In that instance, the resulting amorphous layer is annealed at a high temperature for a specific period of time in order to obtain the desired crystal quality.

Changes in doping or in crystal composition (e.g., the ratio of Al to Ga in Al GaAs) can be obtained by controlling shutters in front of the individual beams. An abrupt change can be accomplished by covering the shutter of a particular constituent. A gradual change can be formed in slowly varying the shutters to obtain the desired result. The flexibility and versatility of the MBE process has made it popular in the semiconductor industry.

Semiconductor doping is a useful process. A dopant is placed in a semiconductor material to vary its electrical characteristics; the dopant resides in the crystalline lattice, but the dopant has slightly different structure from the constituents of the pure semiconductor. A "n-type" semiconductor is produced by using a dopant that has an excess electron, such as phosphorous in a silicon crystal; a "p-type" semiconductor is produced by using a dopant that lacks an electron, such as boron in a silicon crystal. The amount of dopant may be varied to produce lightly doped, or heavily doped semiconductor layers.

Junctions between p-type and n-type semiconductors are fundamental to the performance of amplification, switching, and other important operations in electrical circuits. The idea of a junction is that only the doping is changed; there are no significant changes in the crystal lattice itself. A diode is formed by a single junction of a p-type semiconductor formed adjacent to an n-type semiconductor. The diode generally restricts flow of electrical current to one direction. A bipolar transistor is formed by a combination of n-type, p-type, and n-type layers (a npn transistor) or a combination of p-type, n-type, and p-type layers (a pnp transistor). Another type of transistor, the metal oxide semiconductor field effect transistor (MOSFET), may be formed in a p-type substrate by forming two n-type areas, separated by a gate. In operation, a voltage placed across the gate allows current flow between the two n-type areas.

A junction of semiconductor material may be formed by growing of an epitaxial layer of a semiconductor that is appropriately doped. Epitaxial layers have been described above. Other methods of junction fabrication include difusion and ion implantation.

In the diffusion method, a gas having a high concentration of the dopant atoms is diffused into a semiconductor crystal. For example, a wafer of n-type semiconductor crystal may be placed in a furnace at 1000° C., in a gaseous atmosphere containing a high concentration of boron atoms (a p-type dopant). The boron atoms will diffuse into the surface of the n-type silicon and spread a limited distance into the adjoining silicon by random motion. Thus, looking at the impurity profile, the highest concentration of boron atoms will appear near the surface. The p-type doping concentration will decrease further from the surface, until at the junction the boron concentration decreases below the level of n-type doping. A disadvantage of the diffusion process is that the impurity profile is gradual, not abrupt. The gradualness of the impurity profile causes parasitic electrical resistance in the diffused layer. Another disadvantage of the diffusion process is the high temperature that must be maintained in the diffusion oven. Some materials that are useful in intergrated cirucit fabrication, such as aluminum, melt at temperatures well below 1000° C., and therefore cannot be used together with a diffussion process. Furthermore, the high temperature can cause unwanted diffusion in other portions of the circuit.

In the ion implantation method of doping, energetic ions of the dopant are implanted directly into the semiconductor crystal. A beam of the dopant ions is accelerated to kinetic energies ranging from several keV to several MeV, and is directed to the semiconductor crystal. The dopant ions enter the crystal, and come to rest at an average depth. An advantage of the ion implantation process is that it can be done at relatively low temperatures. Furthermore, selective doping is straightforward; the ions are blocked by metal or photoresist layers. Doping can occur to depths as shallow as tenths of a micron. The impurity profile is more defined using the ion implantation process than by using the diffusion method. However, the diffusion profile is still not perfect; the junction created is not as abrupt as would be preferable for many applications. As another disadvantage, the ion implantation process damages the crystal lattice. This damage can be cured by annealing, which is a heating of the crystal to reform the crystal structure. However, some materials useful in integrated circuit fabrication either cannot be subjected to annealing temperatures, or require special treatment to withstand such temperatures. Also, the annealing process can cause unwanted dopant diffusion, which reduces the abruptness of the junction. As an alternative to raising the temperature of the entire circuit, the surface can be heated locally with a laser.

In a less common doping process, Gas Immersion by Laser Doping (GILD) a laser heats only the surface of a semiconductor substrate that is disposed in an atomsphere having the dopant gas. For example, a laser such as an ultraviolet excimer laser is made incident upon a semiconductor surface. The incident laser radiation heats the material, causing it to melt. The laser pulse can be adjusted in duration and intensity, and thus, the depth of the melt can be precisely controlled. The gas diffuses uniformly in the melt. The separation between the melt and the contiguous solid surface is well defined, which allows the melt to be doped without substantially affecting the surrounding solid material. Thus, when the melt is cooled the junction formed between the differently doped surfaces is very abrupt, a desirable characteristic. As an additional benefit, the cooling melt forms a high quality crystalline lattice, thereby eliminating the high temperature annealing process required with conventional doping techniques such as ion implantation.

In all of the many manufacturing steps, the epitaxial processes, the subsequent masking and removal of unmasked portions, the processes must be carefully controlled and monitored; the complexity of the circuit and the smallness of the integrated circuits require exacting precision in the fabrication processes. Manufacturing is typically performed in "clean" rooms that are specially designed with air filtration systems to remove substantially all the dust in the room and thereby prevent contamination of the integrated circuit during manufacture.

Heterostructure devices comprise a number of layers of semiconductor materials, the layers being stacked. The heterostructure configuration is often used for laser diodes. Heterostructure devices are fabricated in a series of steps beginning with a wafer, which is used as a substrate. Each succeeding layer is grown on the top of the other to form the desired combination of layers. Common methods of growing the layers include MBE, ultra-high vacuum chemical vapor deposition (CVD), and limited reaction processing (LRP). The individual heterostructure device are then separated from the wafer by conventional scribing and cleaving techniques.

A pertinent electriccal characteristic of semiconductor materials is their bandgap, which is defined buy the spacing of the energy bands in an energy diagram. This characteristic is not varied by changing the doping concentration as described above. However, the material's bandgap can be varied by combining different semiconductor materials, as in the heterostructure described above. For example, a mixed layer of germanium (Ge) and silicon (Si) may be grown on a silicon substrate. Such a mixed layer can be described by the term $Ge_x Si_{1-x}$, with "x" referring to the germanium fraction of the layer. Such layers have been grown in bulk, over an entire surface as in the heterostructure described above. However, no method has been available to grow mixed layers in selective regions. If such a method were available, it would provide a semiconductor fabrication that has many applications, for example in fabrication of diodes, or fast, thin base bipolar transistors.

Bipolar transistors are basic building blocks of many common computer chips. The bipolar transistor comprises an emitter, a base, and a collector. Iin operation, the transistor's output is controlled by electrical current through the base. The characteristics of the base, such as its bandgap, its width, and the amount of doping substantially affect the transistor's operating characteristics such as its frequency response, and the maximum speed at which the transistor can be switched. Bipolar transistors may be of the npn type, or the pnp type. Speed of the transistors is enhanced if the base is narrow and highly doped, thereby providing less resistance. However, gain of the transistor is increased by lighter doping of the base. Therefore, it would be an advantage to provide a process for manufacturing a transistor base that is narrow, heavily doped, and has a high gain.

SUMMARY OF THE INVENTION

The present invention comprises a method of selective epitaxy on a semiconductor substrate. The method comprises forming an upper layer over a substrate, and using a laser to melt the upper layer and an adjacent section of the substrate. When cooled, a single crystal epitaxial layer is formed over the patterned substrate. The present invention provides the ability to selectively grow layers of mixed semiconductors over patterned substrates. For example, $Ge_x Si_{1-x}$ layers may be grown over a silicon substrate. Such a process may be used to manufacture transistors that have a narrow base, heavy doping, and high gain.

In a preferred embodiment, a substrate of crystalline semiconductor material is cleaned, an oxide layer is formed thereon, and a reflectivity mask is deposited on top of the oxide layer. Then, selected portions of the reflectivity mask and the oxide layer are removed to uncover the substrate in those selected portions. An upper layer comprising a semiconductor material is deposited over the entire structure formed on the wafer. Specifically, the covered portion of the wafer includes portions of the substrate to be used for selective epitaxy, and portions covered with the reflectivity mask. The wafer is illuminated with an amount of laser radiation selected to melt the upper layer and an adjacent portion of the substrate. Thus, the semiconductor material in the upper layer is heated and diffused into the substrate semiconductor material. However, the incident laser radiation is an amount insufficent to boil the portions of the upper layer on the reflectivity mask. The wafer is then cooled, the unmixed portions of the upper layer are removed and the reflectivity mask is also removed. The result is an epitaxial layer formed in selected epitaxial sections. Further processing may then be performed as appropriate to produce a final product.

The reflectivty mask is applied to cover selected areas. Thus, epitaxial layers are formed only in selected sections. Furthermore, the epitaxial layers may be formed to controlled depths that may be very thin. Also, the interface between the two layers is very abrupt, a feature that has desirable electrical characteristics.

The advantages of the GILD process over conventional processes in semiconductor fabrication are many. The present invention provides a method of selectively forming high quality, thin GeSi layers in a silicon circuit. The invention provides a method for fabricating smaller semiconductor chips with a greater yield (more error free chips) at a lower cost. Narrow, heavily doped bases for transistors possible. The narrowness allows a faster transistor, and the heavy doping reduces the resistance of the narrow layer. Smaller transistors can be formed in semiconductor chips, which is a useful advantage as attempts are made to pack more and more devices onto chips. Because the dopant material is evenly distributed and the junction formed is abrupt, the failure rates of manufactured chips should be less than with conventional methods which may lead to substantial cost savings. And because the process does not require high temperature annealing, materials such as aluminum can be used. The present invention may have aplication in photodetector fabrication and in formation of heterostructures as in laser diodes. For these diodes, it is possible to fabricate diodes with a high reverse breakdown voltage and a low reverse leakage current.

DETAILED DESCRIPTION OF THE INVENTION

Figure 1A:
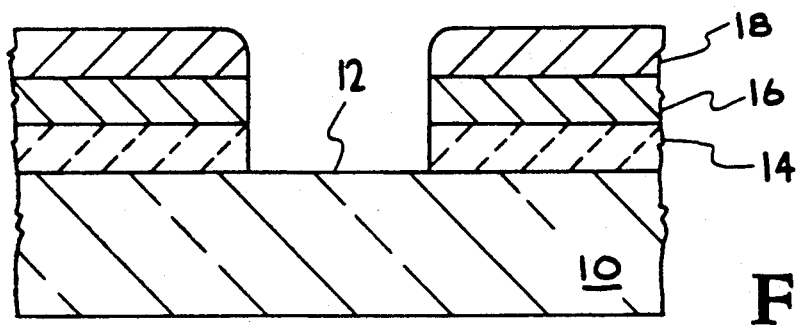
FIGS. 1A-1D illustrate a series of steps in the method for making an epitaxial layer in accordance with the principles of the present invention.

The invention is best understood by reference to the figures wherein like parts are designated with like numerals throughout.

The present invention comprises a method, illustrated in FIGS. 1A-1D, for selective epitaxy on a semiconductor substrate 10. The substrate 10 may comprise silicon (Si) or gallium arsenide (GaAs) in a crystalline form. FIGS. 1A-1D illustrate a cross-section of a portion of a semiconductor chip structure, during selected stages in the method. The substrate 10 is patterned using conventional techniques to expose the substrate 10 in selected regions such as the exposed region 12 illustrated in FIG. 1A. For example, an oxide layer 14 is grown over the substrate 10, and then a reflective layer 16, such as aluminum is deposited on top of the oxide layer 14. A photoresist layer 18 is applied over the reflective layer 16. Using standard lithographic techniques, selected sections of the photoresist layer 18 are illuminated, and then those sections are washed away to expose the underlying sections of the reflective layer 16. The exposed sections of the reflective layer 16 are washed away to expose the underlying sections of the oxide layer 14, which is then removed to expose the region 12 of the substrate 10 for selective epitaxy. This results in the cross-sectional configuration illustrated in FIG. 1A. The photoresist layer is then removed using conventional techniques, leaving the patterned structure that comprises the epitaxial region 12 which is exposed in gaps between the reflective layer 16 and the oxide layer 14.

Figure 1B:
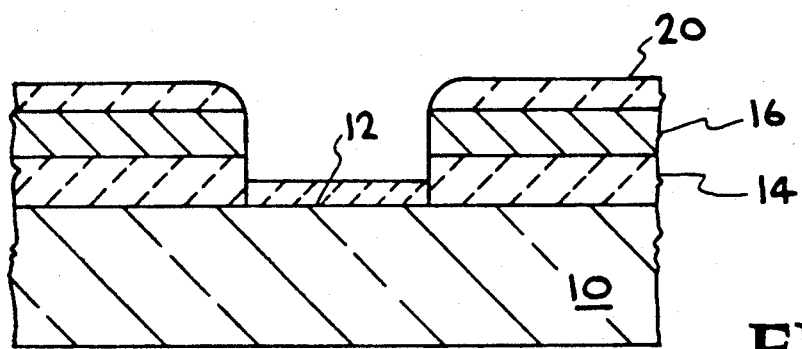

In FIG. 1B, the photoresist layer 18 has been completely removed, and an upper layer 20 is deposited on the patterned structure. The upper layer 20 comprises a substance to be combined with the substrate layer 10 in the selective epitaxial section 12. For example, in the preferred embodiment, the substrate 10 comprises silicon, and the upper layer 20 comprises amorphous germanium. Furthermore, the silicon may be doped and the germanium may be doped; the silicon may be n-type, and the germanium may be p-type.

Figure 1C:
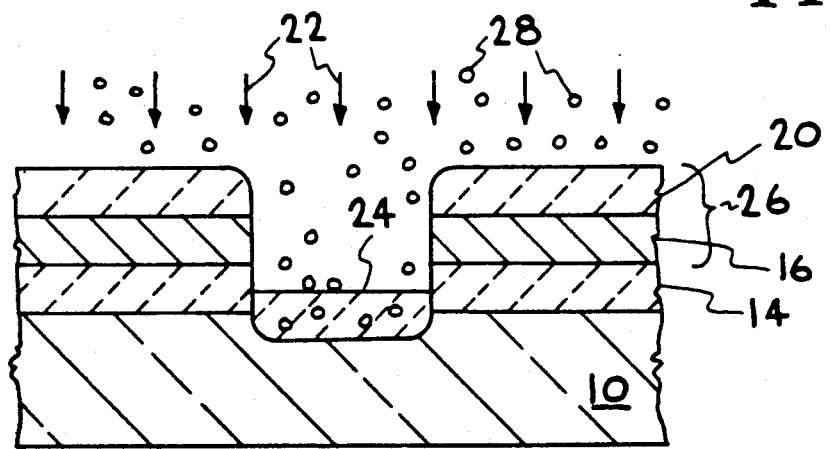

In FIG. 1C, a suitable laser beam 22 has been incident upon the upper layer 20 in an intensity sufficient to melt the portion of the upper layer 20 in the region 12 of the substrate 10, to form a molten region 24. The laser beam 22 may be provided by a conventional laser such as a XeCl excimer laser having a wavelength of 308 Å and a pulsewidth of 29 nanoseconds (FWHM). The laser fluences are chosen to provide a molten region 24 that has the desired depth that may be thin or thick, depending on the desired result. However, the germanium layer 20 must not be heated beyond the boiling point, to avoid splattering and the subsequent possible contamination of the epitaxial region 12. During the process, the laser beam 22 may heat the upper layer 20 sufficiently to combine with the reflective layer 16 to form an alloy layer 26 of the material in the layers 16, 20, but it may not boil the germanium layer 20.

In some applications, a dopant gas 28 may be present with the molten region 24. The dopant gas 28 is diffused into the molten region 24, with the result that the material becomes more highly doped.

Figure 1D:
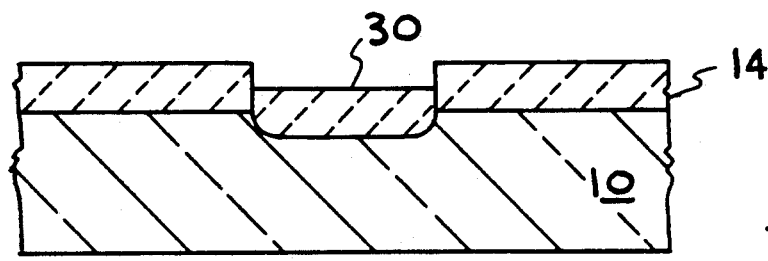

When cooled, the molten region 24, illustrated in FIG. 1C, solidifies into an epitaxial layer 30, illustrated in FIG. 1D. The alloy layer 26 and the reflective layer 16 may then be removed, leaving the structure illustrated in FIG. 1D.

The method comprises using a laser to melt an upper layer and an adjacent section of the substrate. When cooled, a single crystal epitaxial layer is formed over the patterned substrate. The method of the preferred embodiment comprises selectively growing a germanium (Ge) layer on a silicon (Si) substrate. Other combinations of crystal growth may also be encompassed by the method of the present invention. For example, indium may be substituted for Ge, and a gallium arsenide (GaAs) substrate may be substituted for the silicon substrate.

EXAMPLE

Formation of $p^{30}$/n Diodes

The present invention may be used to fabricate $Ge_x$-$Si_{1-x}$/Si $p^+$/n diodes. A plurality of diodes may be fabricated in a parallel process, using a conventional silicon wafer as the substrate 10. The diode fabrication is illustrated with reference to FIGS. 1A–1D. Although FIGS. 1A–1D illustrate only one diode, it will be understood that a large number of small individual diodes may be fabricated on a single silicon wafer. Many thousands or tens of thousands of diodes can be formed on a single wafer.

In this example, a 3-inch (100) n-type (0.1–0.9Ω cm) wafer is cleaned using the standard RCA sequence. The clean wafer is thermally oxidized to form the oxide layer 14 with a width of 2100 Å. After oxidation, a 1.0 micron aluminium(100%) layer is deposited to form the reflectivity mask 16. Standard photolithography is performed and the desired pattern is transferred to the underlying Al(100%) and $SiO_2$ layers to expose the substrate 10 in the selective epitaxial region 12. FIG. 1A shows the one of the diodes at this stage in the process. After removing the photoresist layer 18, the wafer is dipped in a dilute HF solution and immediately placed in an e-beam evaporator where a 70-Å layer 20 of a-Ge is deposited on the patterned substrate 10. The resulting structure is shown in FIG. 1B.

In the next step, illustrated in FIG. 1C, the laser beam 22 is applied to create the molten region 24. The laser heating process is performed in a conventional GILD vacuum cell filled to 5 Torr with a gas dopant such as $BF_3$(100%). Laser fluences ranging from 0.5 to 0.9 J/cm² may be used to fabricate layers with Ge fractions which vary respectively from 11% to 33%. The doping level may be between $5 \times 10^{19}$ and $1 \times 10^{20}$ atoms/cm³. During the laser melting, the a-Ge deposited on the Al(100%) layer alloys with the underlying aluminum to create the alloy layer 26 illustrated in FIG. 1C. After cooling, the molten region 24 becomes the $Ge_xSi_{1-x}$ epitaxial layer 30 illustrated in FIG. 1D.

Following the laser step, the Al/Ge layer is stripped in a hot $H_2SO_4$/$H_2O_2$ bath. As shown in FIG. 1D. Oxide is then deposited, contact holes are defined, and Ti/AlSi(1%) metallization is performed. The metal layer is patterned in a final lithography sequence, resulting in a diode structure.

The selective laser induced epitaxy layers have been analyzed using RBS (Rutherford Backscattering Spectrometry) and electrical measurements, for a $Ge_{0.26}Si_{0.74}p^+$/n diode. The random spectrum indicates a layer thickness of 125 Å. Also, the channeling spectrum indicates that no dechanneling occurred in the crystalline epitaxial region 30. Therefore, the dislocation density should be less than $10^5$/cm².

Figure 3:
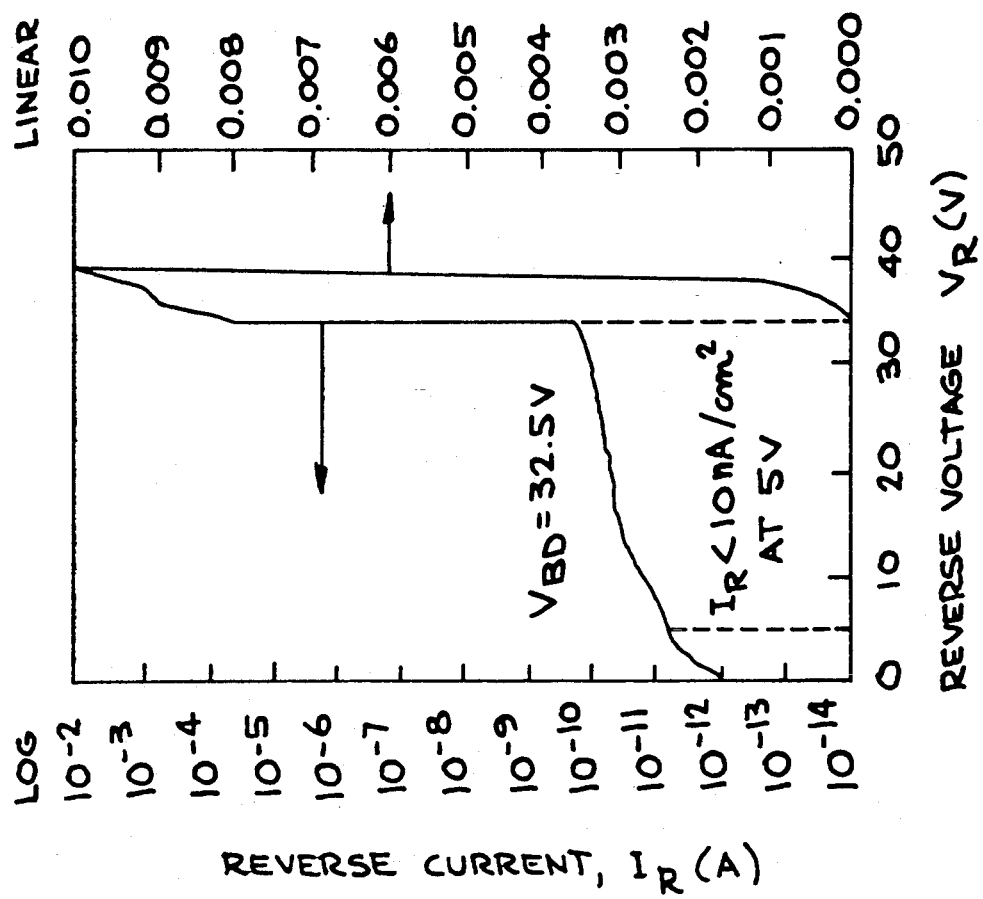
FIG. 3 is a graph of the reverse current-voltage characteristics of a laser diode manufactured in accordance with the present invention.
Figure 2:
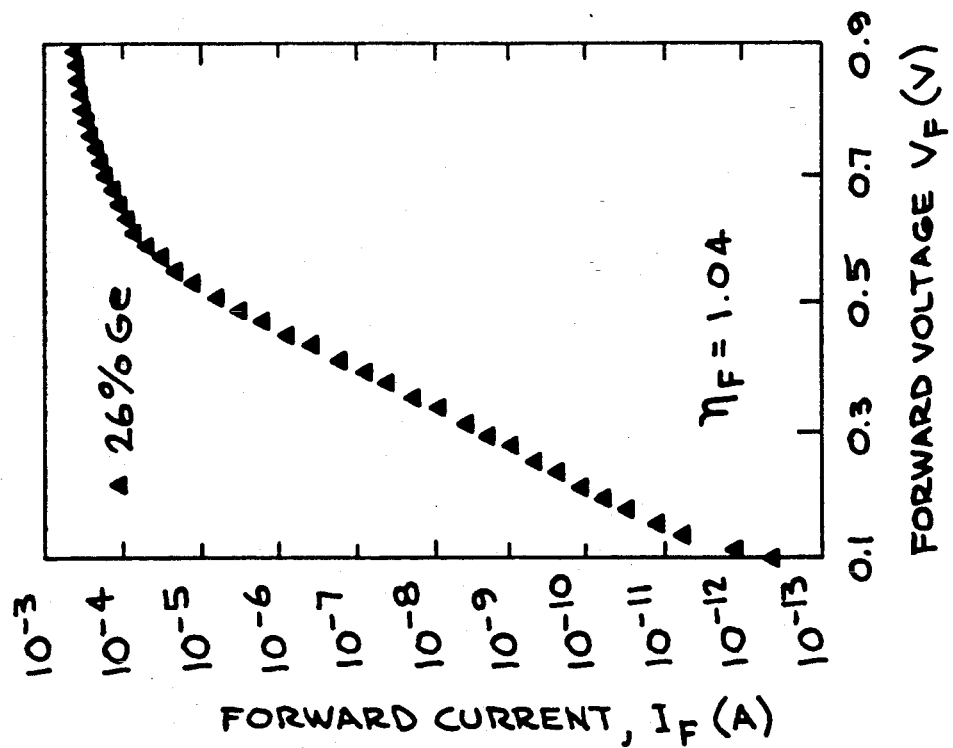
FIG. 2 is a graph of the forward current-voltage characteristics of a laser diode manufactured in accordance with the present invention.

Current-Voltage (I-V) characteristics for the diodes have been measured. The forward characteristics are illustrated in FIG. 2, and the reverse characteristics are illustrated in FIG. 3. The forward characteristics indicate an ideality factor, n=1.04, while the reverse characteristics (FIG. 3) demonstrate a very low leakage current, at −5 V of $I_R$ < 10nA/cm² and a reverse breakdown voltage, $V_{BD}$ > 32 V. In order to attain such low reverse leakage, it is believed that the quality at the $Ge_xSi_{1-x}$/Si interface between the crystalline epitaxial region 30 and the substrate 10 must be good. Furthermore, the sharp reverse breakdown characteristics indicate a substantially defect-free interface between the region 30 and the substrate 10. Consequently, the electrical results suggest that device-quality, selective $Ge_x$-$Si_{1-x}$ layers can be grown using the laser epitaxy process described herein.

The present invention also appears suitable for heterostructure bipolar transistor fabrication. The bandgap of the $GexSi_{1-x}$ layer, and thus the amount of bandgap shrinkage (when compared to single crystal silicon) can be determined electrically by measuring the diode saturation current, $I_s$, as a function of temperature. The bandgap of the heterolayer is directly proportional to the slope from an Arrhenius plot of the data. These measurements have been performed for two diodes with Ge fractions of 10% and 20%. The slope of the data indicates a bandgap in the $Ge_{0.20}Si_{0.80}$ layer of $E_g$=1.04 eV. The same measurement gives a value between 1.1 and 1.2 V for the pure silicon band gap. The measured band gap shrinkage was less than expected. Three possibilities for this discrepancy have been suggested 1) the selective layers do not remain coherently strained during recrystallization, 2) the germanium grading indicated in the RBS analysis reduces the amount of band gap shrinkage, and/or 3) the dopant boron diffuses deeper than the germanium during the laser heating process so the $p^+$/n junction is actually in the silicon.

SIMS (Secondary Ion Mass Spectroscopy) data has been obtained from a laser fabricated $Ge_{0.11}Si_{0.89}$/Si $p^+$/n diode. The SIMS data indicates that the boron junction falls within ~140 Å of the $Ge_xSi_{1-x}$/Si interface. Furthermore, the data indicates that the $p^+$/n junction is contained within the lower-bandgap $Ge_x$-$Si_{1-x}$/Si layer. Therefore, we can rule out the third possibility above. The first possibility can also be dismissed by taking into account the RBS channeling results. To relieve the strain at the interface between the substrate 10 and the crystalline epitaxial section 30, it is believed that a high density of dislocations must be present at the interface. Since the RBS analysis suggests the dislocation density is less than $10^5$ cm⁻², it is believed that the interfaces are continuous. Furthermore, it believed that the interface remains strained. This leaves the second possibility. The SIMS analysis shows that the Ge fraction drops near the interface. However, the grading occurs over a small distance (200–300 Å) and the difference in Ge fraction is less than a factor of 2. The graded potential barrier will allow a greater number of minority carriers to be injected into the n-type region but it is believed that this relatively minor effect is the sole cause of the measured values for $E_g$.

The invention may be embodied in other specific forms without departing from its spirit or essential characteristics. The described embodiment is to be considered in all respects only as illustrative and not restrictive and the scope of the invention is, therefore, indicated by the appended claims rather than by the foregoing descriptions. All changes which come within the meaning and range of equivalency of the claims are to be embraced within their scope.

What is claimed is:

1. A method of selective epitaxy on a semiconductor substrate, said method comprising:
   a. providing a crystalline semiconductor substrate;
   b. forming an oxide layer on the substrate;
   c. depositing a reflectivity mask over the oxide layer;
   d. removing a selected portion of the reflectivity mask and the oxide layer in a selective epitaxy region, thereby uncovering the substrate in the selective epitaxy region;
   e. depositing an upper layer over the substrate in the selective epitaxy region and adjacent portions of the reflectivity mask;
   f. applying laser radiation, so that a molten region is formed in the selective epitaxial region, the molten region comprising the material in the upper layer and the substrate; and,
   g. cooling the resulting structure so that the molten region solidifies to form a crystalline epitaxial section that comprises a mixture of the material in the upper layer and the substrate.

2. The method as claimed in claim 1, further comprising an additional step (i), removing the reflectivity layer.

3. The method as claimed in claim 1, wherein the upper layer comprises a semiconductor material.

4. The method as claimed in claim 3, wherein in the step (f), a dopant gas is diffused into the molten region.

5. The method as claimed in claim 3, wherein the upper layer further comprises a dopant.

6. A method of selective epitaxy on a semiconductor substrate, said method comprising:
   a. providing a crystalline semiconductor substrate;
   b. forming an oxide layer on the substrate;
   c. depositing a metal reflectivity mask over the oxide layer;
   d. removing a selected portion of the reflectivity mask and the oxide layer in a selective epitaxy region, thereby uncovering the substrate in the selective epitaxy region;
   e. depositing an upper layer over the substrate in the selective epitaxy region and adjacent portions of the reflectivity mask, said upper layer comprising a semiconductor material;
   f. applying laser radiation, so that a molten region is formed in the selective epitaxial region, the molten region mixing the semiconductor material in the upper layer with the substrate; and,
   g. cooling the resulting structure so that the molten region solidifies to form a crystalline epitaxial section that comprises a mixture of the semiconductor material in the upper layer and the substrate.

7. The method as claimed in claim 6, wherein the reflectivity layer comprises aluminum.

8. The method as claimed in claim 6, wherein the substrate comprises silicon.

9. The method as claimed in claim 8, wherein the upper layer comprises germanium.

10. The method as claimed in claim 8, wherein the upper layer comprises silicon.

11. The method as claimed in claim 6, wherein the substrate comprises gallium arsenide.

12. The method as claimed in claim 11, wherein the upper layer comprises indium.

13. The method as claimed in claim 11, wherein the upper layer comprises gallium arsenide.

14. A method of selective epitaxy on a semiconductor substrate, said method comprising:
   a. providing a crystalline semiconductor substrate;
   b. forming an oxide layer on the substrate;
   c. depositing a metal reflectivity mask over the oxide layer;
   d. removing a selected portion of the reflectivity mask and the oxide layer in a selective epitaxy region, thereby uncovering the substrate in the selective epitaxy region;
   e. depositing an upper layer over the substrate in the selective epitaxy region and adjacent portions of the reflectivity mask, said upper layer comprising a semiconductor material;
   f. applying laser radiation, so that a molten region is formed in the selective epitaxial region, the molten region mixing the semiconductor material in the upper layer with the substrate;
   g. diffusing a dopant gas into the molten region; and,
   h. cooling the resulting structure so that the molten region solidifies to form a crystalline epitaxial section that comprises a mixture of the semiconductor material in the upper layer, the dopant, and the substrate.

15. The method as claimed in claim 14, wherein the reflectivity layer comprises aluminum.

16. The method as claimed in claim 14, wherein the substrate comprises silicon.

17. The method as claimed in claim 16, wherein the upper layer comprises germanium.

18. The method as claimed in claim 14, wherein the substrate comprises gallium arsenide.

19. The method as claimed in claim 18, wherein the upper layer comprises indium.

20. The method as claimed in claim 18, wherein the upper layer comprises gallium arsenide.

* * * * *